United States Patent
Cuchiaro et al.

(10) Patent No.: US 6,225,156 B1
(45) Date of Patent: May 1, 2001

(54) FERROELECTRIC INTEGRATED CIRCUIT HAVING LOW SENSITIVITY TO HYDROGEN EXPOSURE AND METHOD FOR FABRICATING SAME

(75) Inventors: Joseph D. Cuchiaro, Colorado Springs, CO (US); Akira Furuya, Tokyo (JP); Carlos A. Paz de Araujo, Colorado Springs, CO (US); Yoichi Miyasaka, Tokyo (JP)

(73) Assignees: Symetrix Corporation, Colorado Springs, CO (US); NEC Corporation (JP)

( * ) Notice: Subject to any disclaimer, the term of this patent is extended or adjusted under 35 U.S.C. 154(b) by 0 days.

(21) Appl. No.: 09/062,264

(22) Filed: Apr. 17, 1998

(51) Int. Cl.$^7$ ................................. H01L 21/8242
(52) U.S. Cl. ..................... 438/240; 438/396; 438/253; 438/722
(58) Field of Search ..................... 438/238, 239, 438/240, 396, FOR 430, FOR 220, FOR 189, 253, 722, 448, FOR 438

(56) References Cited

U.S. PATENT DOCUMENTS

| | | |
|---|---|---|
| 5,434,102 | 7/1995 | Watanabe et al. . |
| 5,439,845 | 8/1995 | Watanabe et al. . |
| 5,481,490 | 1/1996 | Watanabe et al. . |
| 5,508,226 | 4/1996 | Ito et al. . |
| 5,523,595 | 6/1996 | Takenaka et al. . |
| 5,784,310 | 7/1998 | Cuchiaro et al. . |
| 5,923,970 | * 7/1999 | Kirlin . |

FOREIGN PATENT DOCUMENTS

| | | |
|---|---|---|
| 8-191137 | 7/1996 | (JP) . |
| 9-92795 | 4/1997 | (JP) . |
| 9-121031 | 5/1997 | (JP) . |
| 9-205181 | 8/1997 | (JP) . |
| 11-121693 | 4/1999 | (JP) . |

OTHER PUBLICATIONS

Article: H. Achard and H. Mace; "Integration of Ferroelectric Thin Films For Memory Applications"; Science and Technology of Electroceramic Thin Films; Kluwer Academic Publishers, 1995; pp. 353–372, inclusive.

Symposium Abstract: Ilsub Chung, et al.; "Integration of Ferroelectric Capacitors Using Multilayered Electrode"; The Tenth International Symposium on the Applications of Ferroelectrics, Aug. 18–21, 1996, Hilton Hotel, East Brunswick, NJ, Rutgers University; p. 55.

Symposium Abstract: Takashi Hase, et al.; "Analysis of the Degradation of PZT and $SrBi_2Ta_2O_9$ Thin Films With A Reductive Process"; The Eighth International Symposium on Integrated Ferroelectrics, Mar. 18–20, 1996, Tempe, AZ; Plenary Talks, Invited Lectures and Contributed Papers, pp. 353–372.

* cited by examiner

Primary Examiner—George Fourson
Assistant Examiner—Barbara E. Abbott
(74) Attorney, Agent, or Firm—Duft, Graziano & Forest, P.C.

(57) ABSTRACT

A hydrogen barrier layer is formed above a ferroelectric thin film in an integrated circuit. The hydrogen barrier layer is directly over a protected segment of the ferroelectric thin film, while a sacrificial segment of the ferroelectric thin film extends laterally beyond the edges of the hydrogen barrier layer. The sacrificial segment absorbs hydrogen so that it cannot diffuse laterally into the protected segment of the ferroelectric thin film. After it absorbs hydrogen, the sacrificial segment is etched away to allow electrical connection to circuit layers below it. The ferroelectric thin film preferably comprises a layered superlattice compound. Excess bismuth or niobium added to the standard precursor solution of a strontium bismuth tantalum niobate compound helps to reduce hydrogen degradation of the ferroelectric properties.

10 Claims, 5 Drawing Sheets

FERROELECTRIC INTEGRATED CIRCUIT HAVING LOW SENSITIVITY TO HYDROGEN EXPOSURE AND METHOD FOR FABRICATING SAME

BACKGROUND OF THE INVENTION

1. Field of the Invention

The invention in general relates to the fabrication of layered superlattice materials and $ABO_3$ type metal oxides, and more particularly to a ferroelectric integrated circuit having low sensitivity to hydrogen exposure and to a method for fabricating such a circuit.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$ type ferroelectric oxides such as PZT (lead titanate zirconate) and PLZT (lanthanum lead titanate zirconate) have been studied for practical use in integrated circuits. Layered superlattice material oxides, have also been studied for use in integrated circuits. See Watanabe, U.S. Pat. No. 5,434,102. Layered superlattice material compounds exhibit characteristics in ferroelectric memories that are orders of magnitude superior to those of PZT and PLZT compounds. While prototypes of ferroelectric memories have been made successfully with the layered superlattice compounds, there is as yet no manufacturing process for making memories using either the $ABO_3$ type oxides or the layered superlattice material compounds with the desired electronic characteristics economically and in commercial quantities. One reason, among others, for the lack of economical commercial processes for the fabrication of high quality ferroelectric integrated circuits is that the metal oxide compounds are susceptible to reduction by hydrogen during hydrogen annealing. Hydrogen annealing is a common step during CMOS integrated circuit memory fabrication and results in degradation of some important ferroelectric properties. This is especially true for the layered superlattice material compounds, which are complex, layered oxides that are especially prone to degradation by hydrogen.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first, bottom electrode and a second, top electrode, the electrodes typically containing platinum. During manufacture of the circuit, the MOSFET is subjected to conditions causing defects in the silicon substrate. For example, the manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 450° C. for a time period of about 30 minutes. In addition, there are several other integrated circuit fabrication processes that expose the integrated circuit to hydrogen, often at elevated temperatures, such as CVD processes for depositing metals, and growth of silicon dioxide from silane or TEOS sources. During processes that involve hydrogen, the hydrogen diffuses through the top electrode and the side of the capacitor to the ferroelectric thin film and reduces the oxides contained in the ferroelectric material. The absorbed hydrogen also metallizes the surface of the ferroelectric thin film. The adhesivity of the ferroelectric thin film to the upper electrode is lowered by the chemical change taking place at the interface. Alternatively, the upper electrode is pushed up by the oxygen gas, water, and other products of the oxidation-reduction reactions taking place. As a result of these effects, the electronic properties of the capacitor are degraded, and peeling is likely to take place at the interface between the top electrode and the ferroelectric thin film. These problems are acute in ferroelectric memories containing layered superlattice compounds because these oxide compounds are particularly complex and prone to degradation by hydrogen-reduction.

3. Solution to the Problem

The invention solves the above problems by providing an integrated circuit and a method for fabricating metal oxide elements in integrated circuits that reduce the detrimental effects of the hydrogen and preserve the favorable electronic properties of the metal oxide element.

One aspect of the invention is formation of a hydrogen barrier layer to cover a protected portion of the metal oxide element.

In a preferred method, a nitride of titanium or silicon is formed to cover the protected portion of the metal oxide element and serve as a hydrogen barrier.

A further aspect of the invention is the formation of a ferroelectric capacitor with a top electrode, a metal oxide thin film and a bottom electrode, such that a portion of the underlying metal oxide layer and of the bottom electrode extend laterally beyond the edge of the top electrode. A hydrogen barrier layer is formed directly over at least a portion of the top electrode and a protected segment of the metal oxide thin film. The metal oxide thin film comprises a sacrificial segment, which preferably is that portion of the metal oxide thin film not directly under the hydrogen barrier layer. After completion of the fabrication steps in which hydrogen damage to the metal oxide can occur, at least part of the sacrificial segment of the metal oxide thin film may be removed by being etched down to the bottom electrode. In a preferred embodiment, the hydrogen barrier layer is patterned with the top electrode layer in the same patterning process, forming a self-aligned top electrode and hydrogen barrier.

A further aspect of the invention is metal oxide material that comprises a metal oxide compound containing at least two metals.

A further aspect of the invention is a thin film of metal oxide material containing a layered superlattice compound. In one embodiment of the invention, the layered superlattice compound comprises strontium bismuth tantalum niobate. A further aspect of the invention is forming a ferroelectric element having layered superlattice compounds containing the chemical elements bismuth, strontium, niobium and tantalum in which the relative amounts of the chemical elements are selected to minimize the degradation of electronic properties by hydrogen.

A further aspect of the invention is forming metal oxide material in which at least one of the constituent metals is present in stoichiometrically excess amounts to form separate metal oxides in the metal oxide material.

In one embodiment, the layered superlattice compound comprises strontium bismuth tantalum niobate, and it contains an excess amount of at least one of the metals from the group comprising bismuth and niobium.

A further aspect of the invention is performing a hydrogen heat treatment of the ferroelectric integrated circuit at a temperature not greater than 400° C., for a time period not greater than 30 minutes in a hydrogen atmosphere containing 0.01 to 50 percent mole fraction of hydrogen.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
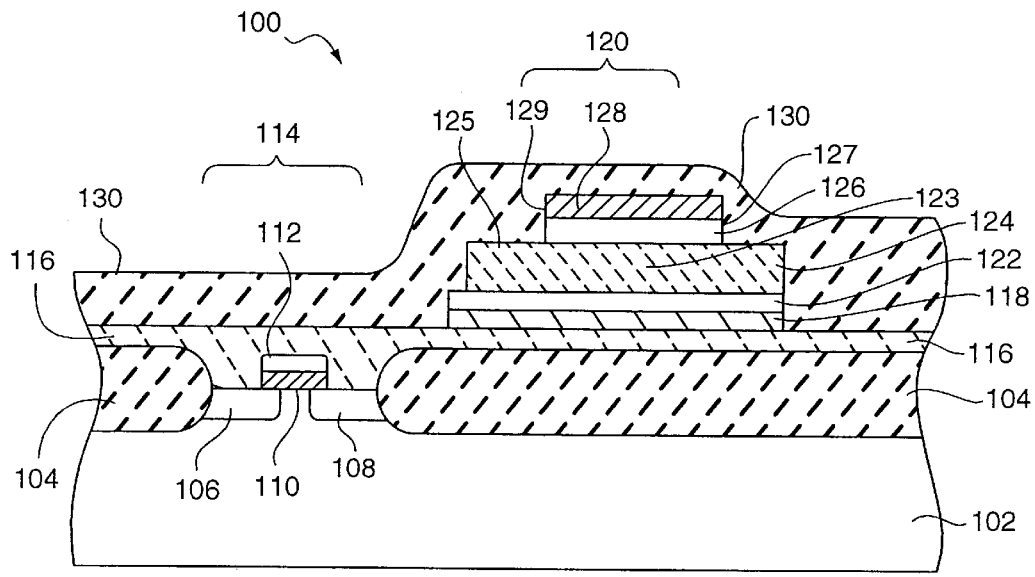
FIG. 1 is a cross-sectional view of an intermediate stage in the fabrication of an integrated circuit as may be performed by the method of the invention showing a nonvolatile ferroelectric memory cell in which a sacrificial portion of the ferroelectric layer extends laterally beyond the edges of a hydrogen barrier layer.

It should be understood that the FIGS. 1–3, 5–7 depicting ferroelectric capacitors and integrated circuit devices are not meant to be actual plan or cross-sectional views of any particular portion of an actual integrated circuit device. In the actual devices the layers will not be as regular and the thicknesses may have different proportions. The various layers in actual devices often are curved and possess overlapping edges. The figures instead show idealized representations which are employed to depict more clearly and fully the structure and process of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. But, it would also be conceivable to use the method of this invention to fabricate a ferroelectric FET memory in which the ferroelectric element is incorporated in the switch element. Such a ferroelectric FET was described in McMillan, U.S. Pat. No. 5,523,964. Likewise, other integrated circuits fabricated using the method of the invention could include other elements and compositions of material.

Directing attention to FIG. 1, there is shown a cross-sectional view of an exemplary nonvolatile ferroelectric memory cell that could be fabricated according to the method of the invention. The general manufacturing steps for fabricating integrated circuits containing MOSFETs and ferroelectric capacitor elements are described in Mihara, U.S. Pat. No. 5,466,629 and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 104 between the source and drain regions 106 and 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116 made of BPSG (boron-doped phosphosilicate glass) is formed on substrate 104 and field oxide region 102. An adhesive layer 118 is formed on a portion of the ILD 116, and then a ferroelectric thin film capacitor 120 is formed on adhesive layer 118. The adhesive layer 118 is made of, for example, titanium, and typically has a thickness of 200 Å. Ferroelectric capacitor 120 is preferably formed on a conventional wafer that may be silicon, gallium arsenide or other semiconductor, or an insulator, such as glass or magnesium oxide (MgO). Adhesive layers, such as titanium, enhance the adhesion of electrodes to adjacent underlying or overlying layers of the circuits.

Figure 7:
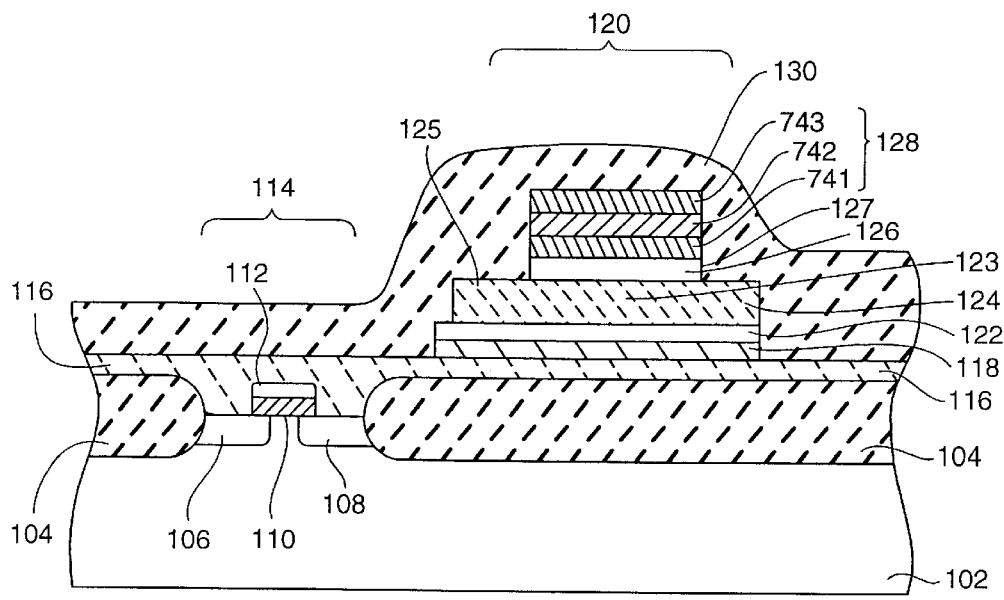
FIG. 7 depicts an alternative embodiment of the invention in which the hydrogen barrier layer comprises three distinct thin films.

In FIG. 1, the ferroelectric capacitor 120 contains a bottom electrode 122 made of platinum and having a thickness of 2000 Å, a ferroelectric thin film 124 formed on the bottom electrode 122, a top electrode 126 formed on the ferroelectric thin film 124, made of platinum and having a thickness of 2000 Å, and preferably an electrically conductive hydrogen barrier layer 128 formed on the top electrode 126 and having a thickness of 500–2000 Å. The bottom and top electrodes of a capacitor conventionally contain platinum. It is preferable that the bottom electrode contain a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. The hydrogen barrier layer 128 can comprise a single film, for example, titanium nitride or silicon nitride, or it can contain two or more films, for example, a bottom film of titanium, then a film of titanium nitride followed by a titanium film. FIG. 7 depicts an alternative embodiment of the invention in which the hydrogen barrier layer 128 comprises three distinct thin films, 741, 742, and 743, which preferably comprise a layer 741 of titanium, a layer 742 of titanium nitride, and a layer 743 of titanium. If the barrier layer 128 is made from electrically conductive material, such as titanium nitride, and acts as a conducting element, then it can be formed self-aligned with the top electrode 126. By self-aligned, means that they are formed in a process in which the barrier layer automatically aligns with the top electrode. For example, if both the top electrode 123 and the hydrogen barrier 128 are patterned together in the same photomask and etch patterning process, they will be self-aligned. The hydrogen barrier layer 128 can be deposited using a conventional sputtering technique. The composition of the ferroelectric thin film 124 is discussed in more detail below.

An second interlayer dielectric layer (ILD) 130 made of NSG (nondoped silicate glass) is formed on ILD 116. A PSG (phospho-silicate glass) film or a BPSG film could also be used in layer 130.

Fabrication of the ferroelectric element, for example, the capacitor in FIG. 1, conventionally involves steps with oxidizing conditions that may damage the switch 114 and other elements of the integrated circuit. After the ferroelectric element has been formed, a hydrogen heat treatment of the circuit is usually performed to repair oxidation damage of the switch. During this hydrogen treatment as well as during other high-energy steps, the ferroelectric properties of the ferroelectric thin film 124 are prone to degrade because hydrogen reacts with the oxides that the ferroelectric thin film 124 comprises. A significant portion of the hydrogen diffuses vertically into the ferroelectric thin film through the top electrode if no hydrogen barrier layer is directly over the ferroelectric thin film. But, some of the hydrogen that diffuses into the ferroelectric diffuses laterally from the edges of the ferroelectric thin film.

In FIG. 1, the top electrode and hydrogen barrier layer are formed such that the ferroelectric thin film 124, the bottom electrode 122, and the adhesion layer 118 extended laterally beyond the outer edge 127 of the top electrode 126 and beyond the outer edge 129 of the hydrogen barrier layer. The portion 125 of the ferroelectric thin film 124 that extends beyond the hydrogen barrier layer edge 129 is a sacrificial segment 125 of the ferroelectric thin film 124. The portion 123 of the ferroelectric thin film 124 that the hydrogen barrier layer is directly over in the vertical direction is a protected segment 123 of the ferroelectric thin film 124. According to the invention, the sacrificial segment 125 absorbs hydrogen during the hydrogen heat treatment and during other fabrication steps causing hydrogenating or reducing conditions. The absorbed hydrogen reacts with the oxides in the sacrificial portion 125 and is, thereby, not able to degrade the desirable ferroelectric properties in the remaining protected portion 123 of the ferroelectric thin film 124. Thus, the sacrificial segment 125 acts as a hydrogen "getter," and protects the protected portion 123 of ferroelectric thin film 124. According to one embodiment of the invention, in the etching steps that typically follow the hydrogen treatment, at least a portion of the sacrificial segment 125 covering a portion of the bottom electrode is removed down to the bottom electrode.

Figure 2:
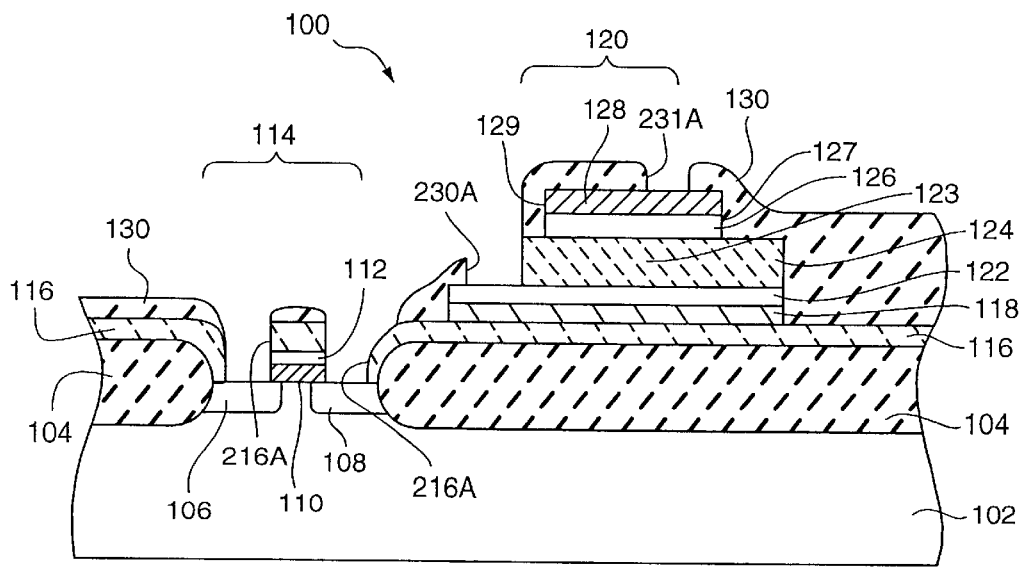
FIG. 2 is a cross-sectional view of a further intermediate stage in the fabrication of an integrated circuit as may be performed by the method of the invention showing a nonvolatile ferroelectric memory cell in which a portion of the sacrificial segment of the ferroelectric layer extending beyond the top electrode has been etched away down to the bottom electrode.

In FIG. 2, openings 216a are selectively opened through ILD 130 and ILD 116 to expose the source region 106 and gate region 108. Opening 231a is selectively opened through the ILD 130 to expose the electrically conductive hydrogen barrier layer 128. Opening 230a is selectively opened through the ILD 130 to expose at least a portion of the sacrificial segment 125 of the ferroelectric thin film 124. In opening 230a at least a portion of the sacrificial segment 125 is removed by an etching process down to the surface of the bottom electrode 122.

Figure 3:
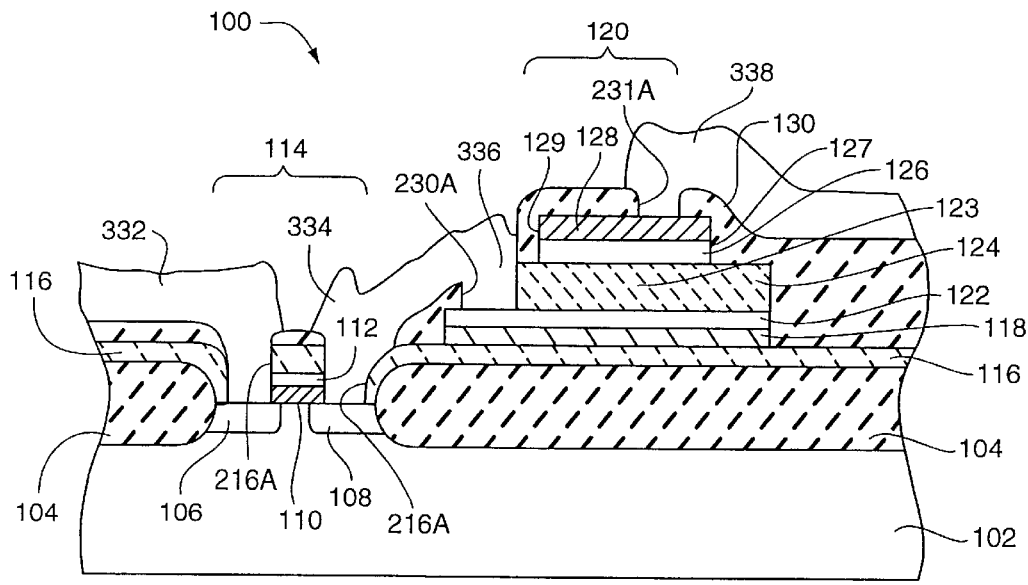
FIG. 3 is a cross-sectional view of a further intermediate stage in the fabrication of an integrated circuit as may be performed by the method of the invention showing a nonvolatile ferroelectric memory cell in which a portion of the sacrificial segment of the ferroelectric layer extending beyond the top electrode has been etched away down to the bottom electrode and a wiring layer has filled the etch hole.

As shown in FIG. 3, source electrode wiring 332 and drain electrode wiring 334 are formed to fill openings 216a. Bottom electrode wiring 336 and top electrode wiring 338 are formed to fill the openings 230a and 231a, respectively. The drain electrode wiring 334 is electrically connected to bottom electrode wiring 336, and preferably is the same wiring element. Each of these wirings 332, 334 336 and 338 is made of Al—Si—Cu (1% Si, 0.5% Cu) with a thickness of about 3000 Å. If barrier layer 128 is nonconductive, then it is necessary to remove at least a portion of the barrier layer 128 so that the wiring layer 338 can make electrical contact to top electrode 126. If barrier layer 128 is conductive, but significantly less conductive than top electrode 126, then it is probably desirable to remove at least a portion of the barrier layer so that wiring layer 338 can make electrical contact to top electrode 126.

The composition of the ferroelectric thin film 124 can be selected from a group of suitable ferroelectric materials, including but not limited to: an $ABO_3$-type metal-oxide perovskite, such as a titanate (e.g., $BaTiO_3$, $SrTiO_3$, $PbTiO_3$ (PT), $PbZrTiO_3$ (PZT)), a niobate (e.g., KNbO3), and, preferably, a layered superlattice compound.

$ABO_3$ type metal oxides are a well-known group of ferroelectric and high dielectric constant materials. See, for example, Franco Jona and G. Shirane, *Ferroelectric Crystals*, Dover Publications, N.Y., p. 108. U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. Nos. 5,434,102 issued Jul. 18, 1995 and 5,468,684 issued Nov. 21, 1995, incorporated herein by reference, describe processes for integrating these materials into practical integrated circuits.

The layered superlattice materials may be summarized generally under the formula: (1)

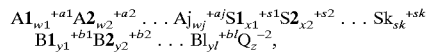

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by a strontium atom and 25% of the A-sites are occupied by a barium atom. If there is only one A-site element in the compound then it is represented by the "A1" element and w2 . . . wj all equal zero. If there is only one B-site element in the compound, then it is represented by the "B1" element, and y2 . . . y1 all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements.

The value of z is found from the equation:

$$(a1w1+a2W2 \ldots +ajwj)+(s1x1+s2x2 \ldots +skxk)+(b1y1+b2y2 \ldots +b1y1)=2z. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "substrate" can mean the underlying wafer 102 on which the integrated circuit is formed, as well as any object on which a thin film layer is deposited, such as BPSG layer 116. In this disclosure "substrate" shall mean the object to which the layer of interest is applied; for example, when we are talking about a bottom electrode, such as 122, the substrate includes the layers 118 and 116 on which the electrode 122 is formed.

The terms "above", "upper", and "lower" herein mean relative to the silicon substrate 102. That is, if a second element is "above" a first element, it means it is farther from the substrate 102, and if it is "below" another element, then it is closer to the substrate 102 than the other element. The long dimension of substrate 102 defines a plane that is considered to be a "horizontal" plane herein, and directions perpendicular to this plane are considered to be "vertical".

The term "thin film" is used herein as it is used in the integrated circuit art. Generally it means a film of less than a micron in thickness. The thin films disclosed herein are in all instances less than 0.5 microns in thickness. Preferably the ferroelectric thin films 124 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein, may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material. In this disclosure an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 124 made according to the process of the invention will generally be less than that in the stoichiometric formula for the precursor. However, the molar proportions of strontium, tantalum, and niobium in ferroelectric layer 124 made according to the process of the invention will be very close or identical to the molar proportions given in the stoichiometric formula for the precursor. See U.S. Pat. No. 5,434,102 issued to Watanabe et al.

Based on the Watanabe et al. U.S. Pat. No. 5,434,102 patent and related work, the precursor for making layered superlattice materials preferred by those skilled in the art presently has the stoichiometric formula $SrBi_{2.18}Ta_{1.44}Nb_{0.56}O_9$. It is believed that a precursor with this formula will result in a final solid strontium bismuth tantalum niobate thin film with the balanced stoichiometric formula $SrBi_2Ta_{1.44}Nb_{0.56}O_9$. That is, the final thin film does not contain excess bismuth because the excess bismuth in the precursor is carried away as bismuth oxide gas during the fabrication process. This precursor solution contains amounts of chemical precursors corresponding to the stoichiometric ratio $SrBi_{2.18}Ta_{1.44}Nb_{0.56}O_9$. This stoichiometric formula is referred to herein as the "standard" formula having the "standard" ratio of niobium to tantalum. A precursor having the standard stoichiometric formula includes about 9% excess bismuth. That is, the standard stoichiometric formula includes an amount of bismuth above what is required to bond with all the strontium, tantalum and niobium in the precursor to form a layered superlatice compound with all atomic sites in the crystal occupied. One feature of the invention is that a final layered superlattice compound with excess metal, that is amounts of at least one metal, such as bismuth and niobium, above or in addition to that shown in the standard formula is more resistant to degradation by hydrogen than material made with a precursor having the standard formula. A related feature is that excess amounts of a B-site element, such as niobium, in a layered superlattice material are effective in preventing the degradation of the electronic properties by exposure to hydrogen.

Figure 4:
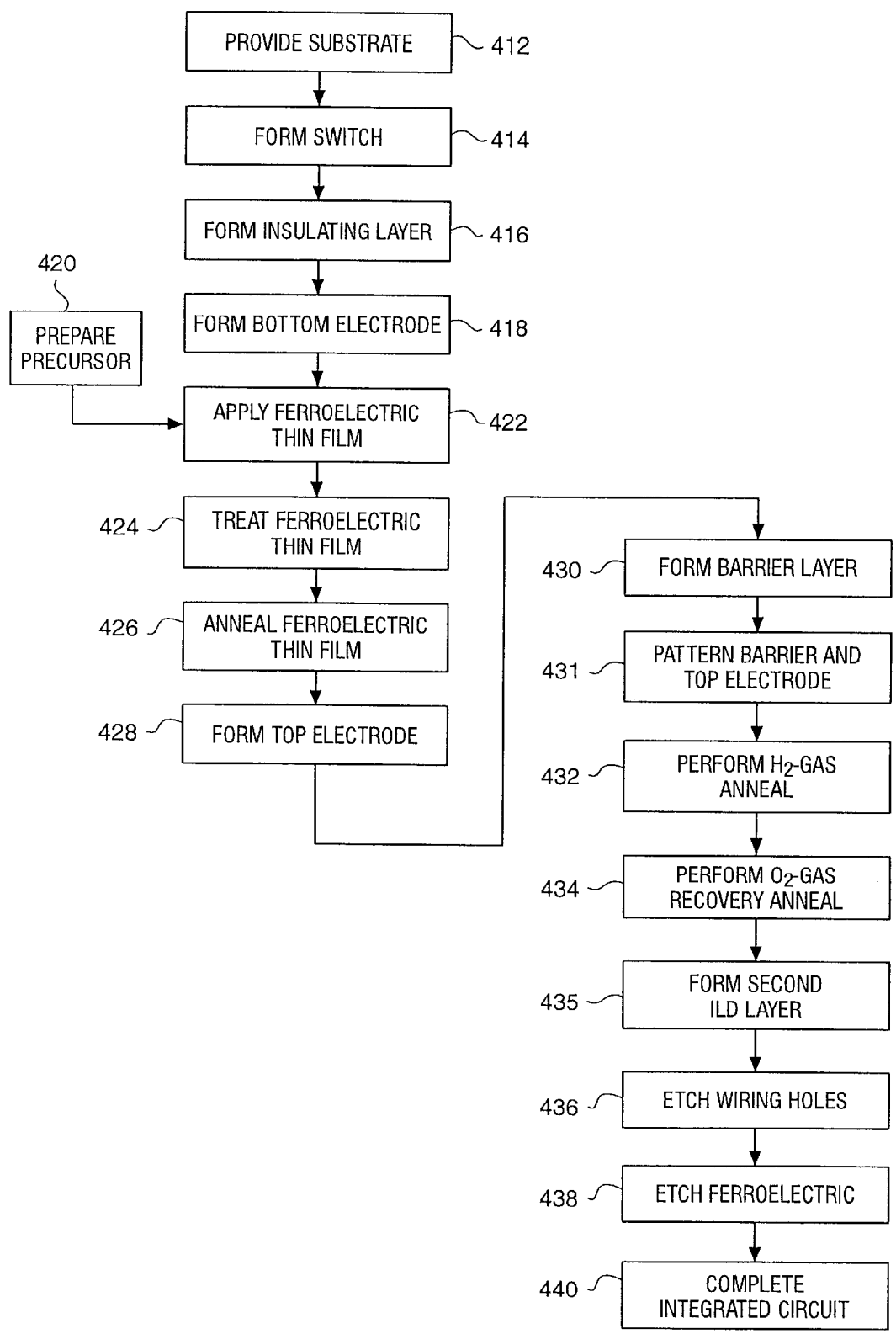
FIG. 4 is a flow chart showing a preferred embodiment of a process for fabricating a nonvolatile ferroelectric memory device according to the invention.
Figure 5:
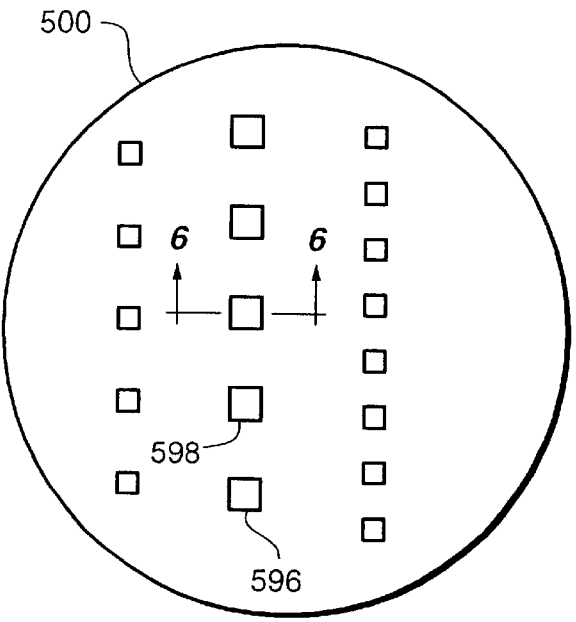
FIG. 5 is a top view of an exemplary wafer on which thin film capacitors covered by a hydrogen barrier layer are shown greatly enlarged.
Figure 6:
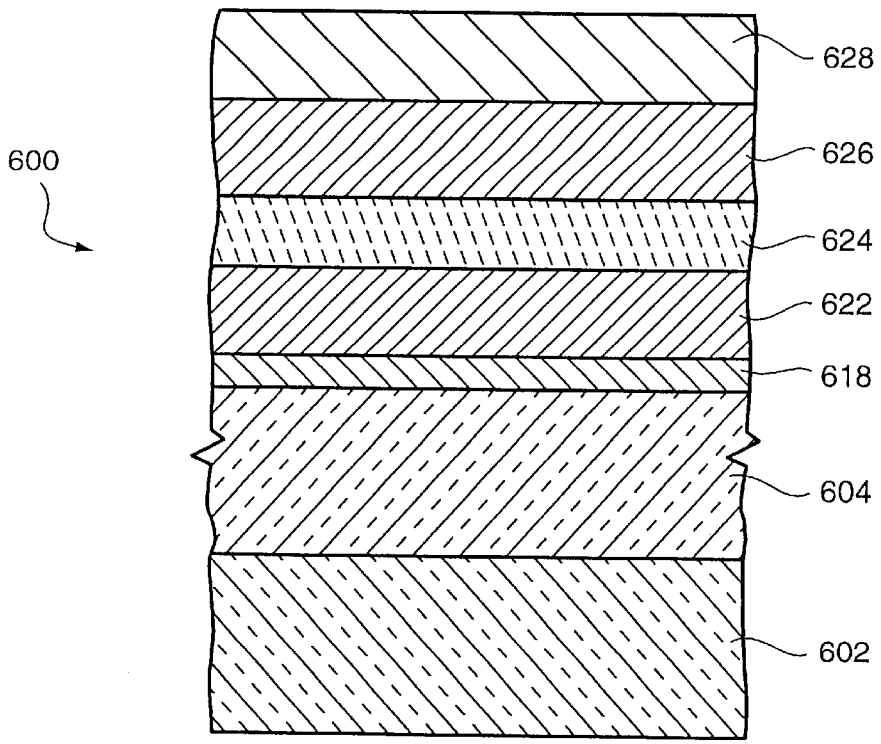
FIG. 6 is a portion of a cross-section of FIG. 5 taken through the lines 6—6, illustrating a thin film capacitor device.

The diagram of FIG. 4 is a flow sheet of the fabrication steps used in this invention to make a ferroelectric memory 100. In step 412, a semiconductor substrate 102 (FIG. 3) is provided on which a switch 114 is formed in step 414. The switch is typically a MOSFET. In step 416, an insulating layer 116 is formed to separate the switching element from the ferroelectric element to be formed. In step 418, a bottom electrode 122 is formed. Preferably the electrode is made of platinum and is sputter-deposited to form a layer with a thickness of about 2000 Å. In the preferred method, an adhesion layer 118 made of titanium or titanium nitride of about 200 Å would be formed in this step, preferably by sputtering, prior to depositing the electrode. In step 420, chemical precursors of the layered superlattice compounds that will form the desired ferroelectric thin film are prepared. The ferroelectric thin film 124 is applied to the bottom electrode in step 422. In the preferred method, the ferroelectric thin film contains layered superlattice compounds. The ferroelectric thin films are preferably applied using a liquid deposition technique, such as spin-coating or a misted deposition method as described in U.S. Pat. No. 5,546,945. In the most preferred method, a spin-on technique is used to form the thin film. Usually, a final precursor solution is prepared from commercially available solutions containing the chemical precursor compounds. Preferably, the concentrations of the various precursors supplied in the commercial solutions are adjusted in step 420 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. It is often desirable, however, to add extra niobium or bismuth to this solution to generate extra oxides that will protect the ferroelectric compounds from hydrogen-annealing degradation. The application step 422 is preferably followed by a treatment step 424 which preferably includes a drying step and a crystallization substep at elevated temperatures such as a rapid thermal process; treatment step 424 may include treatment with ultraviolet radiation during or after the application step 422. Steps 422 and 424 may be repeated as necessary to form a film of the desired thickness. For example, in a typical spin-on procedure, a coat of the precursor might be applied and dried. Then another precursor coat might be applied and dried. The treated film is then annealed in oxygen to form the resulting ferroelectric thin film 124 in step 426. Patterning steps via processes such as ion milling and ashing, as known in the art, are also included as appropriate in the fabrication of capacitor 120. For example, preferably, step 418 includes such a patterning step, and another such patterning step follows step 426. Following steps 422–426, the top electrode 126 is formed in step 428. In the preferred method, a hydrogen barrier layer 128 is formed in step 430 directly over the top electrode of the capacitor and the protected segment of the ferroelectric thin film. Typically, the hydrogen barrier layer 128 is titanium nitride, which inhibits diffusion of hydrogen into the ferroelectric covered by it and which is also electrically conductive. It is also desirable to add a small amount of oxygen to the barrier layer by including a small amount of $O_2$-gas in the sputter atmosphere during sputter-deposition of the barrier layer. The resulting oxides that form in the barrier layer protect the ferroelectric compounds in the memory device by reacting with the hydrogen that can be present in various manufacturing process steps. Yet, the amount of oxide is small enough that it does not significantly interfere with the conductive properties of the barrier layer. Barrier layer formation step 430 is preferably followed by a patterning step 431 in which the barrier layer 128 and the top electrode 126 are patterned, preferably in an ion etching process. In step 432, hydrogen annealing of the ferroelectric memory 100 is conducted at a temperature and annealing time chosen to satisfactorily eliminate the defects caused in the silicon substrate by oxidation and to minimize hydrogen degradation of the ferroelectric compounds. The hydrogen annealing step is preferably performed with $H_2$-gas in a gas mixture at atmospheric pressure because this is less complex than other alternatives. In step 434, an oxygen-recovery anneal is performed to restore the electronic properties of the ferroelectric element 120 that were degraded as a result of hydrogen annealing and other process steps causing reducing conditions. A second ILD layer 130 is then deposited in step 435. In step 436, holes 216a, 230a, and 231a are made through the ILD layers 116 and 130 to the switch 114 (typically to the source and drain regions of a MOSFET), to the sacrificial segment 125, and to the hydrogen barrier layer 128, respectively, by using one or several dry or wet etching methods. Alternatively, the second ILD layer 130 can be formed and holes to the switch can be made before the hydrogen annealing in order to facilitate transport of the hydrogen gas to the switch region of the circuit. In step 438, a portion of the sacrificial segment 125 of the ferroelectric thin film 124 that extends laterally beyond the edge of the top electrode 126 is etched away down to the bottom electrode 122. If the hydrogen barrier layer 128 is not sufficiently electrically conductive, then at least a portion of hydrogen barrier layer 128 must be removed to enable electrical connection to the top electrode 126. The circuit is completed in the next steps 440, which typically include deposition of a wiring layer and its patterning to form wirings 332, 334, 336, and 338, deposition of a passivation layer, and packaging.

A ferroelectric element typically comprises a relatively flat thin film of ferroelectric material. The terms "lateral" or "laterally" refer to the direction of the flat plane of the thin film. Referring to FIGS. 1–3, 6 the lateral direction would be the horizontal direction.

This specification refers to a hydrogen barrier layer being formed directly over a thin film of ferroelectric material. By "directly over" is meant that the barrier layer is above at least a portion of the ferroelectric thin film in the vertical direction in FIGS. 1–3. For example, in FIG. 1, the hydrogen barrier layer 128 is directly over the protected segment 123 of the ferroelectric thin film 124. A vertical line extending down from hydrogen barrier layer 128 intersects protected segment 123; therefore, hydrogen barrier layer 128 is directly over protected segment 123. But, hydrogen barrier layer 128 is not directly over the peripheral, sacrificial segment 125 of ferroelectric thin film 124 because sacrificial segment 125 extends laterally beyond the edge 129 of hydrogen barrier layer 128. The term "directly over" does not mean that the barrier layer is in direct contact with the ferroelectric layer. The barrier layer may or may not contact the ferroelectric layer. As long as it is directly over a portion of the ferroelectric layer, it will protect that portion from hydrogen diffusion. In similar terms, protected segment 123 is "directly under" hydrogen barrier layer 128, but sacrificial segment 125 is not directly under hydrogen barrier layer 128. It is clear that ferroelectric elements can be fabricated with varying orientations relative to the horizontal and vertical. For example, if the ferroelectric thin film is in the vertical plane, then the word "lateral" would refer to the vertical direction, and "directly over" would refer to an orientation normal to the vertical plane of the thin film.

Experiments have shown that lateral diffusion of the hydrogen through the ferroelectric thin film, that is, diffusion in a direction parallel to the plane of the ferroelectric thin film, is slow compared with diffusion in a direction normal to the plane of the ferroelectric film. It is, therefore, believed that a small portion of the ferroelectric material at the lateral edges of the ferroelectric layer 124 acts as a getter for any hydrogen that may penetrate in the lateral direction and protects the rest of the material from hydrogen. A primary feature of the invention, therefore, is forming a ferroelectric thin film 124 comprising a sacrificial portion 125 that "getters" hydrogen which could otherwise cause hydrogen degradation in the remaining portions of the ferroelectric that are covered by a hydrogen barrier layer. Generally, the combination of the sacrificial portion 125 with the barrier layer is sufficient to protect the protected portion 123 from significant degradation upon conventional hydrogen processes. However, depending on the intensity of the hydrogen exposure in the various hydrogenating and reducing steps in a fabrication process, use of additional protective measures can be helpful. For these reasons, the method of the invention contemplates the use of various other steps to protect the memory device from damage by hydrogen. These steps can be used in conjunction with a sacrificial segment and hydrogen barrier layer.

In the preferred method of the present invention, the hydrogen heat treatment of the integrated circuit is conducted at atmospheric pressure in a $H_2$—$N_2$ gas mixture with 1–5 percent (1–5%) $H_2$, at a temperature of 200° C. for 10 minutes. The beneficial effects of the low-temperature, short-duration hydrogen heat treatment are significant up to a temperature of 350° C. and a duration of 30 minutes. The hydrogen heat treatment of the invention can be performed in a hydrogen atmosphere in which the volume percent of hydrogen gas is in the range from 0.01 to 50 percent. This is because diffusion of hydrogen within the integrated circuit is a slow, rate-determining step, which is not heavily dependent on the ambient concentration of hydrogen.

The low-temperature, short-duration hydrogen annealing method of the present invention is effective in protecting the electronic characteristics of nonvolatile ferroelectric capacitors in which the ferroelectric thin film contains Bi-layered superlattice material made from a precursor with a composition corresponding approximately to the general formula $SrBi_{2.18}Ta_{2-x}Nb_x$, where $0 \leq x \leq 2$. Experiments have shown that the low-temperature short-duration hydrogen heat treatment is most effective in protecting superlattice compounds made from a precursor solution with a composition corresponding approximately to the general stoichiometric formula $SrB_{2.18}Ta_{1.44}Nb_{0.56}O_9$, in which the mole ratio Nb/Ta in the precursor is about 0.4. Experiments have further shown that addition of bismuth or niobium to the precursor in excess of the relative amounts corresponding to the formula $SrB_{2.18}Ta_{1.44}Nb_{0.56}O_9$ is effective in protecting desired electronic characteristics from hydrogen degradation. Hydrogen degradation of the ferroelectric properties can also be partially or fully reversed to regain good electronic characteristics by means of oxygen recovery annealing.

Other process sequences and steps may also be used. For example, holes for the MOSFET contact wiring can be opened before hydrogen treatment, while holes through the insulating layer to the electrodes of the ferroelectric element can be made after the hydrogen heat treatment step.

EXAMPLE 1

The effect of covering the platinum top electrode of strontium bismuth tantalum niobate capacitors with a hydrogen barrier made of titanium nitride was studied. The capacitors were fabricated from a strontium bismuth tantalum niobate solution commercially available from Hughes Aircraft Company, Product No. HAC10475-47. The solution contained amounts of chemical precursors corresponding to the stoichiometric formula $SrB_{2.18}Ta_{1.44}Nb_{0.56}O_9$. This stoichiometric formula is referred to in this specification as the "standard" concentration. It should be understood, however, that the formula merely represents the relative ratios of the various chemical species in the commercially available precursor solutions. The 0.2 mol/l solution in this example contained: tantalum 2-ethylhexanoate, bismuth 2-ethylhexanoate, strontium 2-ethylhexanoate, niobium 2-ethylhexanoate, 2-ethylhexanoate, and xylene. Ferroelectric capacitors containing the layered superlattice compound were formed from the precursor solution in general accordance with the method described in Watanabe, U.S. Pat. No. 5,434,102, which is hereby incorporated by reference as if wholly contained herein. Remanent polarization (2Pr), coercive field ($E_c$), and leakage current in the capacitors were measured before and after hydrogen treatment.

A series of p-type 100 Si wafer substrates 602 (FIG. 6) were oxidized to form a layer of silicon dioxide 604. A titanium adhesive layer 618 of 200 Å thickness was sputtered on the substrate, then a bottom platinum electrode 622 of 3000 Å thickness was sputter-deposited on adhesive layer 618. These were annealed 30 minutes in $O_2$ at 650° C., and dehydrated 30 minutes at 180° C. in low vacuum. A spincoat of 0.2 molar solution of the strontium bismuth tantalum niobate compound was deposited on the bottom electrode 622 at 1500 rpm for 30 seconds. This was pyrolized for 1 minute at 160° C., increasing to 260° C. for 4 minutes. The sequence of the spincoat and pyrolized steps was repeated. The ferroelectric coating was crystallized using rapid-thermal-processing, sometimes referred to as rapid-thermal-annealing (RTA) in which the wafer was held at 725° C. for 30 sec and was raised to temperature at a rate of 100° C./sec. These steps formed a ferroelectric thin film 624 having a thickness of 2100±150 Å. The wafer and deposited layers were given a first anneal for 60 minutes at 800° C. Platinum was sputter-deposited to make a top electrode layer 626 with 2000 Å thickness, followed by photoresist patterning. The platinum and strontium bismuth tantalum niobate layers were ion etched to form the capacitors, and then ashing was performed to remove the photo resist mask, followed by a second $O_2$ anneal for 30 minutes at 800° C. Then, thin films of titanium nitride 628 were sputter deposited about 1800 Å thick on the strontium bismuth tantalum niobate capacitors at various deposition conditions. The capacitors were hydrogen-annealed in a $H_2$—$N_2$ ($H_2$ 5%) gas mixture with a flowrate of 4 l/m at 400° C. and atmospheric pressure for 10, 30 and 60 minutes. The capacitors had an area of 7845 $\mu m^2$. After hydrogen annealing, the titanium nitride films were removed by a solution of $NH_4OH:H_2O_2:H_2O$ (1:3:1) at 60° C. After drying of the capacitors in a vacuum oven, hysterisis measurements over the range of 1 to 10 volts and I–V tests were conducted.

The titanium nitride films 628 were deposited on the top electrode of the capacitors using a titanium nitride sputter target with argon gas at gas pressures of 5, 8 and 12 mTorr and at 25, 50 and 100 W power, base pressure $5 \times 10^{-7}$ Torr. The titanium nitride films most effective in protecting the strontium bismuth tantalum niobate capacitors against hydrogen degradation were the films with highest density, that is, the films produced at 100 W and 5 mTorr. These films had a density of 4.19 grams per cubic centimeter (g/cm) and an electrical resistivity of about 0.50 milliohms per centimeter (mΩcm). The sides of the capacitors were not coated with barrier layers.

The hysterisis curves of samples in which the titanium nitride layer was sputtered at 100 W and 5 mTorr were measured before hydrogen annealing and after hydrogen annealing at 10, 30, and 60 minutes. The curves were almost the same even after 60 minutes of annealing as before annealing. The remanent polarization, 2Pr, in capacitors with the titanium nitride layer sputtered at 100 W and 5 mTorr was measured at 5 volts before hydrogen annealing and after hydrogen annealing at 10, 30 and 60 minutes. The values of 2Pr in all the $H_2$-annealed samples degraded only about 10% from the values before $H_2$-treatment. The leakage currents of capacitors in which the titanium nitride layer was sputtered at 100 W and 5 mTorr were measured before hydrogen annealing and after hydrogen annealing at 10, 30, and 60 minutes. The leakage current measured at 3 volts was approximately equal in all the samples that had undergone hydrogen annealing. The value was only about $10^{-6}$ A/cm$^2$. These results show the benefit of providing a nitride hydrogen barrier according to the inventive method. They also demonstrate that significant protection of the desirable electronic properties of the ferroelectric thin film against hydrogen degradation can be achieved by applying a hydrogen barrier layer vertically above the ferroelectric thin film. Since, in most cases, the layers below the ferroelectric layer are sufficiently thick to prevent hydrogen diffusion to the ferroelectric, the most important hydrogen barrier is a barrier that is deposited in one of the layers directly over the ferroelectric thin film. The barrier layer may or may not contact the ferroelectric layer. As long as it is directly above a portion of the ferroelectric layer, it will protect that portion from hydrogen diffusion.

On the other hand, the results also clearly show that protection of the ferroelectric properties with only a top barrier layer is not complete. Therefore, the method of the invention provides for forming a ferroelectric thin film with a sacrificial segment that absorbs hydrogen and prevents the hydrogen from further diffusing into the protected segment of the ferroelectric thin film covered by the hydrogen barrier.

EXAMPLE 2

The electronic properties of strontium bismuth tantalum niobate capacitors were studied before and after annealing in $H_2$-gas at temperatures of 200°, 250° and 300° C. for 10, 30 and 60 minutes. Strontium bismuth tantalum niobate capacitors were again prepared according to the procedure used in Example 1 from precursor solution obtained from Hughes Aircraft Company, HAC10709-30.

Before the capacitors were annealed in hydrogen gas, the electronic properties of five capacitors, each with an area of 7854 $\mu m^2$, were measured. The leakage current in the capacitors was about $10^{-7}$ A/cm$^2$ at 5 volts. Remanent polarization (2Pr) measured at 5 volts was about 23 $\mu C/cm^2$. In the fatigue test which was performed on one of the capacitors, the 2Pr value reduced about 5 percent after $10^{10}$ cycles.

Hydrogen annealing was then performed on capacitors in a $H_2$—$N_2$ ($H_2$ 1%) mixture under ambient conditions, at 200°, 250°, and 300° C. for 10, 30, and 60 minutes.

Figure 8:
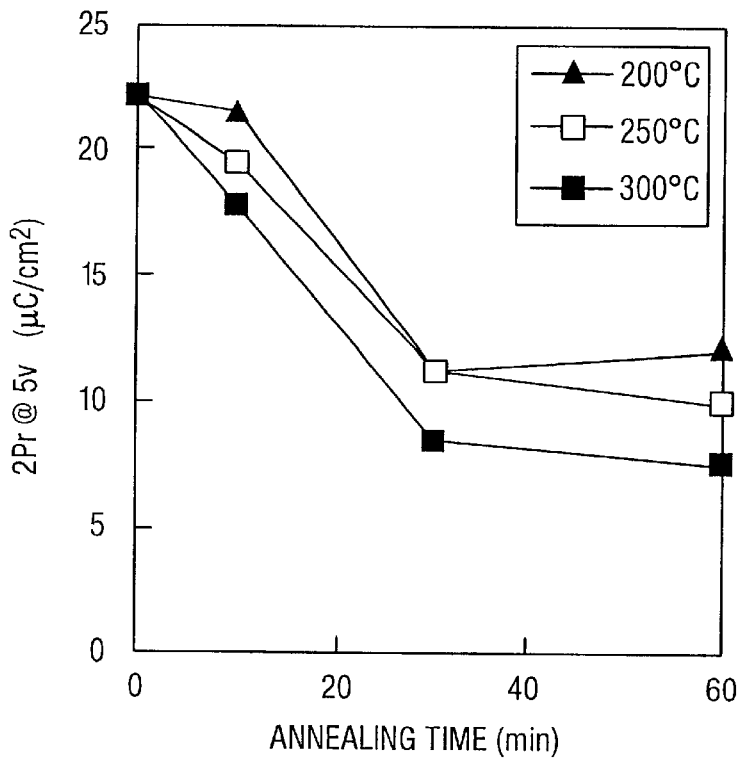
FIG. 8 is a graph of remanent polarization, 2Pr@5V, plotted as a function of annealing time in strontium bismuth tantalum niobate capacitors annealed for three different annealing temperatures.

FIG. 8 is a graph of remanent polarization, 2Pr, at 5 volts as a function of annealing time in capacitors annealed at 200°, 250° and 300° C. FIG. 8 shows that hydrogen heat treatment at the lowest temperature, 200° C., and the shortest duration, 10 minutes, results in the least degradation of 2Pr value.

The current density of the samples annealed at 200° C. for 10 minutes was about $10^{-7}$ A/cm$^2$ at 5 volts, equivalent to the value before annealing, and satisfactory for use in memory devices. The leakage current in the other samples, however, was unsatisfactorily high.

Comparison of these results with the results of Example 1, in which the hydrogen heat treatment was performed at 400° C. for 60 minutes, shows the effectiveness of using a hydrogen barrier layer.

Figure 9:
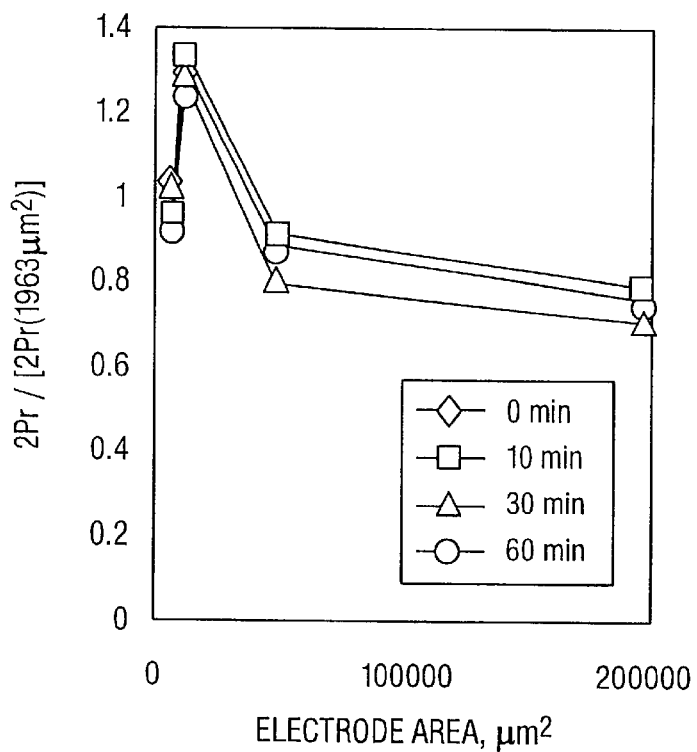
FIG. 9 is a graph of normalized remanent polarization, $2Pr/[2Pr(1963 \mu m^2)]$, at 5 V, plotted as a function of capacitor electrode area for four different hydrogen annealing times.

The effect of the hydrogen heat treatment on remanent polarization was also measured and compared in capacitors of different surface areas. Remanent polarization was measured in capacitors with a surface area ranging from 1963 to 196300 $\mu m^2$. The data are plotted in the graph of FIG. 9. The vertical axis in FIG. 9 is normalized to 2Pr of 1963 $\mu m^2$. The data show that degradation of 2Pr did not strongly depend on the lateral area of the ferroelectric thin film under the particular conditions of the experiment. This does not mean that lateral diffusion of hydrogen is insignificant or nonexistent. Rather, it suggests that the movement of hydrogen by diffusion in a lateral direction starting at the edges of the ferroelectric thin film is relatively slow, and that the degradation of ferroelectric properties due to lateral diffusion of hydrogen is localized at the edges of the ferroelectric thin film.

Additional Bi or Nb added to the standard precursor solution and present in the layered superlattice compound in the ferroelectric thin film protects a strontium bismuth tantalum niobate capacitor against degradation by hydrogen annealing. These additional elements form additional oxides, and they inhibit hydrogen degradation probably by consuming hydrogen that would otherwise reduce the strontium bismuth tantalum niobate oxides. Preliminary results with other B-site materials, such as titanium, tantalum, hafnium, tungsten and zirconium, indicates that excess amounts of other B-site materials will also inhibit the degradation resulting from exposure to hydrogen.

As discussed above, a feature of the invention is to provide a hydrogen barrier layer that covers a protected segment of the ferroelectric layer, while a sacrificial segment of the ferroelectric absorbs hydrogen so that it cannot diffuse into the protected segment. For some integrated circuit devices, better protection against hydrogen degradation can be achieved with additional measures. To keep the exposure to hydrogen small, a low-temperature, short-duration hydrogen heat treatment should be applied where possible. Also, good ferroelectric properties can be obtained by using precursors with excess metal oxide, such as excess bismuth oxide and/or excess niobium oxide. Further, use of additional oxygen in integrated circuit layers laid down subsequent to the ferroelectric layers, such as an insulating layer laid down subsequent to the fabrication of the ferroelectric layer, which oxygen acts as a getter for hydrogen during subsequent hydrogen treatments, can also be effectively used either alone or in combination with one or more of the above measures. In this manner, the invention provides processes and/or structures that enable the prevention of the degradation of ferroelectric elements in combination with almost any exposure to hydrogen that is necessary to create and perfect the other portions of the integrated circuit.

There has been described a method and structure for fabricating ferroelectric integrated circuits that permit exposure to hydrogen and still result in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that providing a sacrificial segment of the ferroelectric layer has been identified as an important part of the process for fabricating ferroelectric memory devices, this method can be combined with other processes to provide variations on the method described. It is also evident that the steps recited may in some instances be performed in a different order. Or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating an integrated circuit comprising the sequential steps of:

providing a substrate;

forming on said substrate a thin film of metal oxide material having a protected segment and a sacrificial segment, said thin film having a thickness less than 0.5 micron;

forming a hydrogen barrier layer directly over said protected segment of said thin film of metal oxide material, wherein said hydrogen barrier layer is not directly over said sacrificial segment;

performing an $H_2$-gas anneal; and then etching away a portion of said sacrificial segment.

2. A method according to claim 1 wherein said hydrogen barrier layer comprises a nitride of titanium or silicon.

3. A method according to claim 1 wherein said metal oxide material comprises an oxide compound containing at least two metals.

4. A method according to claim 3 wherein at least one of said metals is present in said material in an excess amount.

5. A method according to claim 1 wherein said thin film of metal oxide material comprises a layered superlattice compound.

6. A method according to claim 5 wherein said layered superlattice compound comprises strontium bismuth tantalum niobate.

7. A method according to claim 6 wherein said layered superlattice compound contains an excess amount of at least one of the metals from the group consisting of bismuth and niobium.

8. A method according to claim 1 characterized in that said step of performing an $H_2$-gas anneal comprises heating said integrated circuit portion in an atmosphere including hydrogen at a temperature not greater than 400° C., for a time period not greater than 30 minutes, wherein the mole fraction of hydrogen in said hydrogen atmosphere is from 0.01 to 50 percent.

9. A method for fabricating an integrated circuit comprising the sequential steps of:

providing a substrate;

forming a bottom electrode on said substrate;

forming a thin film of metal oxide material above said bottom electrode, said thin film having a protected segment and a sacrificial segment, and said thin film having a thickness less than 0.5 micron;

forming a top electrode directly over at least a portion of said protected segment of said thin film of metal oxide material;

forming a hydrogen barrier layer directly over at least a portion of said top electrode and directly over said protected segment of said thin film of metal oxide material, wherein said hydrogen barrier layer is not directly over said sacrificial segment;

performing an $H_2$-gas anneal; and then etching away a portion of said sacrificial segment.

10. A method for fabricating an integrated circuit comprising the seguential steps of:

providing a substrate;

forming a bottom electrode on said substrate;

forming a thin film of metal oxide material above said bottom electrode, said thin film having a thickness less than 0.5 micron;

forming a top electrode layer directly over at least a portion of said metal oxide material;

forming a hydrogen barrier layer directly over at least a portion of said top electrode;

patterning said top electrode layer and said hydrogen barrier layer in the same patterning process thereby forming a self-aligned top electrode and hydrogen barrier;

performing an $H_2$-gas anneal; and then etching away a portion of said metal oxide material.

* * * * *